US010503402B2

(12) United States Patent
Berger et al.

(10) Patent No.: US 10,503,402 B2
(45) Date of Patent: Dec. 10, 2019

(54) ARCHITECTURE AND IMPLEMENTATION OF CORTICAL SYSTEM, AND FABRICATING AN ARCHITECTURE USING 3D WAFER SCALE INTEGRATION

(71) Applicant: International Business Machines Corporation, Armonk, NY (US)

(72) Inventors: Daniel G. Berger, New Paltz, NY (US); Troy L. Graves-Abe, Wappingers Falls, NY (US); Subramanian S. Iyer, Mount Kisco, NY (US); Toshiaki Kirihata, Poughkeepsie, NY (US); Arvind Kumar, Chappaqua, NY (US); Winfried W. Wilcke, Los Altos Hills, CA (US)

(73) Assignee: International Business Machines Corporation, Armonk, NY (US)

( * ) Notice: Subject to any disclaimer, the term of this patent is extended or adjusted under 35 U.S.C. 154(b) by 148 days.

(21) Appl. No.: 15/855,693

(22) Filed: Dec. 27, 2017

(65) Prior Publication Data

US 2018/0136846 A1 May 17, 2018

Related U.S. Application Data

(63) Continuation of application No. 14/713,689, filed on May 15, 2015, now Pat. No. 9,886,193.

(51) Int. Cl.
*G06F 3/06* (2006.01)
*H01L 25/18* (2006.01)
(Continued)

(52) U.S. Cl.
CPC .......... *G06F 3/0604* (2013.01); *G06F 3/0629* (2013.01); *G06F 3/0673* (2013.01);
(Continued)

(58) Field of Classification Search
CPC .................................................... G06F 3/0604
(Continued)

(56) References Cited

U.S. PATENT DOCUMENTS

| 7,493,295 | B2 | 2/2009 | Ayala |
| 8,017,439 | B2 | 9/2011 | Takahashi et al. |

(Continued)

FOREIGN PATENT DOCUMENTS

| CN | 101107618 A | 1/2008 |
| EP | 0 267360 B1 | 8/1992 |
| EP | 0 727 748 A1 | 2/1995 |

OTHER PUBLICATIONS

Kim, et al., "Mapping of Neural Networks onto the Memory-Processor Integrated Architecture", Neural Networks, vol. 11, No. 6, 1998, pp. 1-29.
(Continued)

*Primary Examiner* — Suresh Memula
(74) *Attorney, Agent, or Firm* — Scully, Scott, Murphy & Presser, P.C.; Alvin Borromeo, Esq.

(57) ABSTRACT

A processor-memory system, a stacked-wafer processor-memory system, and a method of fabricating a processor-memory system are disclosed. In an embodiment, the invention provides a processor-memory system comprising a memory area, a multitude of specialized processors, and a management processor. The specialized processors are embedded in the memory area, and each of the specialized processors is configured for performing a specified set of operations using an associated memory domain in the memory area. The management processor is provided to control operations of an associated set of the specialized processors. In one embodiment, each of the specialized processors controls a respective one associated memory domain in the memory area. In an embodiment, the processor-memory system further comprises a specialized proces-
(Continued)

sor wafer. The specialized processor wafer includes the memory area, and the multitude of specialized processors are embedded in the specialized processor wafer.

20 Claims, 15 Drawing Sheets

(51) Int. Cl.
*H01L 25/00* (2006.01)
*H01L 21/768* (2006.01)

(52) U.S. Cl.
CPC .............. *H01L 25/18* (2013.01); *H01L 25/50* (2013.01); *H01L 21/76898* (2013.01); *H01L 2224/16225* (2013.01); *H01L 2225/06513* (2013.01); *H01L 2225/06517* (2013.01); *H01L 2225/06527* (2013.01); *H01L 2225/06541* (2013.01); *H01L 2225/06589* (2013.01)

(58) Field of Classification Search
USPC ...................................................... 716/100
See application file for complete search history.

(56) References Cited

U.S. PATENT DOCUMENTS

| | | | |
|---|---|---|---|
| 8,037,010 B2 | 10/2011 | Jaros et al. | |
| 8,156,057 B2 | 4/2012 | Nugent | |
| 8,518,741 B1 | 8/2013 | Lu et al. | |
| 8,549,447 B2 | 10/2013 | Eisenstadt | |
| 8,582,373 B2 | 11/2013 | Hollis | |
| 8,655,815 B2 | 2/2014 | Palmer et al. | |
| 8,725,658 B2 | 5/2014 | Izhikevich et al. | |
| 8,744,349 B2 | 6/2014 | Kuroda | |
| 8,788,441 B1 | 7/2014 | Commons et al. | |
| 8,843,425 B2 | 9/2014 | Modha | |
| 9,432,298 B1* | 8/2016 | Smith | H04L 49/9057 |
| 2003/0102495 A1* | 6/2003 | Huppenthal | G06F 15/7867 257/209 |
| 2003/0188086 A1 | 10/2003 | Singh | |
| 2004/0054505 A1 | 3/2004 | Lee | |
| 2005/0023656 A1 | 2/2005 | Leedy | |
| 2005/0201356 A1 | 9/2005 | Miura et al. | |
| 2006/0184462 A1 | 8/2006 | Hawkins | |
| 2008/0154822 A1 | 6/2008 | Loeser et al. | |
| 2008/0201286 A1 | 8/2008 | Hawkins et al. | |
| 2009/0070721 A1 | 3/2009 | Solomon | |
| 2010/0078790 A1* | 4/2010 | Ito | G11C 5/02 257/686 |
| 2011/0106742 A1 | 5/2011 | Pino | |
| 2011/0108888 A1* | 5/2011 | Or-Bach | H01L 21/76254 257/204 |
| 2011/0188209 A1* | 8/2011 | Colgan | B23P 11/00 361/729 |
| 2011/0272788 A1 | 11/2011 | Kim et al. | |
| 2012/0166763 A1* | 6/2012 | Henry | G06F 1/3206 712/40 |
| 2012/0197823 A1 | 8/2012 | Hawkins et al. | |
| 2012/0323832 A1 | 12/2012 | Snook et al. | |
| 2012/0331269 A1 | 12/2012 | Aras | |
| 2013/0267046 A1* | 10/2013 | Or-Bach | H01L 27/088 438/14 |
| 2013/0328177 A1 | 12/2013 | Cho et al. | |
| 2013/0341803 A1 | 12/2013 | Cheah et al. | |
| 2014/0156577 A1 | 6/2014 | Eliasmith et al. | |
| 2016/0012004 A1* | 1/2016 | Arimilli | G06F 13/4027 710/306 |
| 2017/0077389 A1 | 3/2017 | Nelson et al. | |
| 2019/0205244 A1* | 7/2019 | Smith | G06F 12/0246 |

OTHER PUBLICATIONS

Lee et al., "Three-Dimensional Shared Memory Fabricated Using Wafer Stacking Technology", International Electron Devices Meeting, IEDM'00, 2000, pp. 165-168.

Taouil et al., "On Maximizing the Compound Yield for 3D Wafer-to-Wafer Stacked ICs", Paper 6.2, 2010 IEEE, ICs in IEEE International Test Conference (TC)—Nov. 2010, pp. 1-10.

Lee et al., "Highly Dependable 3-D Stacked Multicore Processor System Module Fabricated Using Reconfigured Multichip-on-Wafer 3-D Integration Technology", in Electron Devices Meeting, 1988. IEDM'88, Technical Digest, Inernational 2015, Dec. 2014, pp. 28.6.1-28.6.4.

PCT/CN2016/082224, International Search Report dated Jul. 18, 2016.

List of IBM Patents or Patent Applications Treated as Related.

* cited by examiner

ARCHITECTURE AND IMPLEMENTATION OF CORTICAL SYSTEM, AND FABRICATING AN ARCHITECTURE USING 3D WAFER SCALE INTEGRATION

CROSS REFERENCE TO RELATED APPLICATION

This application is a continuation of copending U.S. patent application Ser. No. 14/713,689, filed May 15, 2015, the entire content and disclosure of which is hereby incorporated herein by reference in its entirety.

BACKGROUND

This invention generally relates to stacked, multi-wafer structures, to architectures and systems using such structures, and to fabricating a multi-wafer structure using three-dimensional wafer scale integration.

Huge quantities of data are being generated in the world in unconventional and unstructured formats (text, video, images, sentiment, etc.). Making useful sense of this data requires new cognitive computing techniques similar to the way the human brain processes information.

These techniques, which require very high memory and communication bandwidths, reach fundamental limitations in a conventional von Neumann architecture, which suffers from a bottleneck between the separated CPU and memory.

SUMMARY

Embodiments of the invention provide a processor-memory system, a stacked-wafer processor-memory system, and a method of fabricating a processor-memory system. In an embodiment, the invention provides a processor-memory system comprising a memory area, a multitude of specialized processors, and a management processor. The specialized processors are embedded in the memory area, and each of the specialized processors is configured for performing a specified set of operations using an associated memory domain in the memory area. The management processor is provided to control operations of an associated set of the specialized processors.

In one embodiment, each of the specialized processors controls a respective one associated memory domain in the memory area.

In an embodiment, the processor-memory system further comprises a specialized processor wafer. The specialized processor wafer includes the memory area, and the multitude of specialized processors are embedded in the specialized processor wafer.

In an embodiment, the management processor includes a subordinate general management processor and a lead general management processor. The subordinate general management processor is connected to said associated set of the specialized processors for controlling said associated set of the specialized processors, and the lead general management processor is in communication with the subordinate general management processor for transmitting data to and receiving data from the subordinate general management processor.

In one embodiment, the processor-memory system further comprises a wiring wafer. The lead general management processor and the subordinate general management processor are connected to the wiring wafer; and the wiring wafer includes a wiring level connecting the lead general management processor to the subordinate general management processor for transmitting commands and information between the lead general management processor and the subordinate general management processor.

In an embodiment, the invention provides a stacked-wafer processor-memory system comprising a plurality of specialized processor wafers, a plurality of subordinate general management processors, and a lead general management processor. The plurality of specialized processor wafers are arranged in a stack, and each of the specialized processor wafers comprises a memory area and a multitude of specialized processors embedded in the memory area of the each specialized processor. Each of the specialized processors performs a specified set of operations using a respective one associated memory domain of the memory area of the each specialized processor wafer. Each of the subordinate general management processors is connected to and controls operations of a respective one associated set of the specialized processors, and the lead general management processor is provided for communicating with the subordinate general management processors and with external input/output connections.

In one embodiment, each of the specialized processor wafers further comprises a wiring level connecting together the specialized processors of the each specialized processor wafer.

In one embodiment, the stacked-wafer processor-memory system further comprises a network of inter-strata through silicon vias for delivering power and ground to the specialized processor wafers and for communicating with the general management processors.

In an embodiment, the stacked-wafer processor-memory system further comprises a wiring wafer comprising a plurality of wiring levels. The lead general management processor and the plurality of subordinate general management processors are connected to the wiring levels of the wiring wafer; and the wiring wafer is mounted on top of the plurality of specialized processor wafers.

In one embodiment, the stacked-wafer processor-memory system further comprises an interposer. The plurality of specialized processor wafers are stacked on the interposer, and the lead general management processor and the subordinate general management processors are mounted on the interposer.

In an embodiment, the invention provides a method of fabricating a processor-memory system, comprising fabricating one or more specialized processor wafers, where each of the specialized processor wafers comprises a memory area and a multitude of specialized processors embedded in the memory area of the each specialized processor wafer, connecting a plurality of subordinate general management processors to the specialized processors, and connecting a lead general management processor to the subordinate general management processors. Each of the specialized processors is configured to perform a specified set of operations using an associated memory domain of the memory area of the each specialized processor wafer, each of the subordinate general management processors is configured to manage an associated set of the specialized processors; and the lead general management processor is provided to communicate with the subordinate general management processors.

In one embodiment, the fabricating one or more specialized processor wafers includes adding a wiring level to each of the specialized processor wafers to connect together the specialized processors of the each specialized processor wafer.

In an embodiment, the method further comprises fabricating a wiring wafer, said wiring wafer including wiring levels for the lead general management processor and the subordinate general management processors. The connecting a plurality of subordinate general management processors to the specialized processors includes connecting the plurality of subordinate general management processors to the wiring levels of the wiring wafer, and the connecting a lead general management processor to the subordinate general management processors includes connecting the lead general management processor to the wiring levels of the wiring wafer.

In an embodiment, the fabricating one or more specialized processor wavers includes fabricating a plurality of specialized processor wafers; and the method further comprises forming a network of inter-strata through silicon vias for delivering power and ground to the specialized processor wafers and for communicating with the general management processors, bonding the plurality of specialized processor wafers together in a stack, and bonding the wiring wafer onto a top of the stack.

In an embodiment, the fabricating one or more specialized processor wafers includes for each of the specialized processor wafers, forming a wiring pattern connecting together the specialized processors of the each specialized processor wafer. The forming a wiring pattern includes using a common mask to form a wiring layer, and using a mask stepping size the same as a stepping size used for individual specialized processors in the each specialized processor wafer; using an additional mask for express bus customization; and connecting together the specialized processors of the each processor wafer using adaptive segmented stitching to allow isolation of defective ones of the specialized processors.

Embodiments of the invention provide a system-level hardware architecture, referred to as a Cortical System, which greatly alleviates the CPU-memory bandwidth problem of conventional computer systems. Embodiments of the invention provide a structure, and a method of fabricating the structure, to realize the above-architecture using the technique of three-dimensional wafer scale integration (WSI).

DETAILED DESCRIPTION

Figure 1:
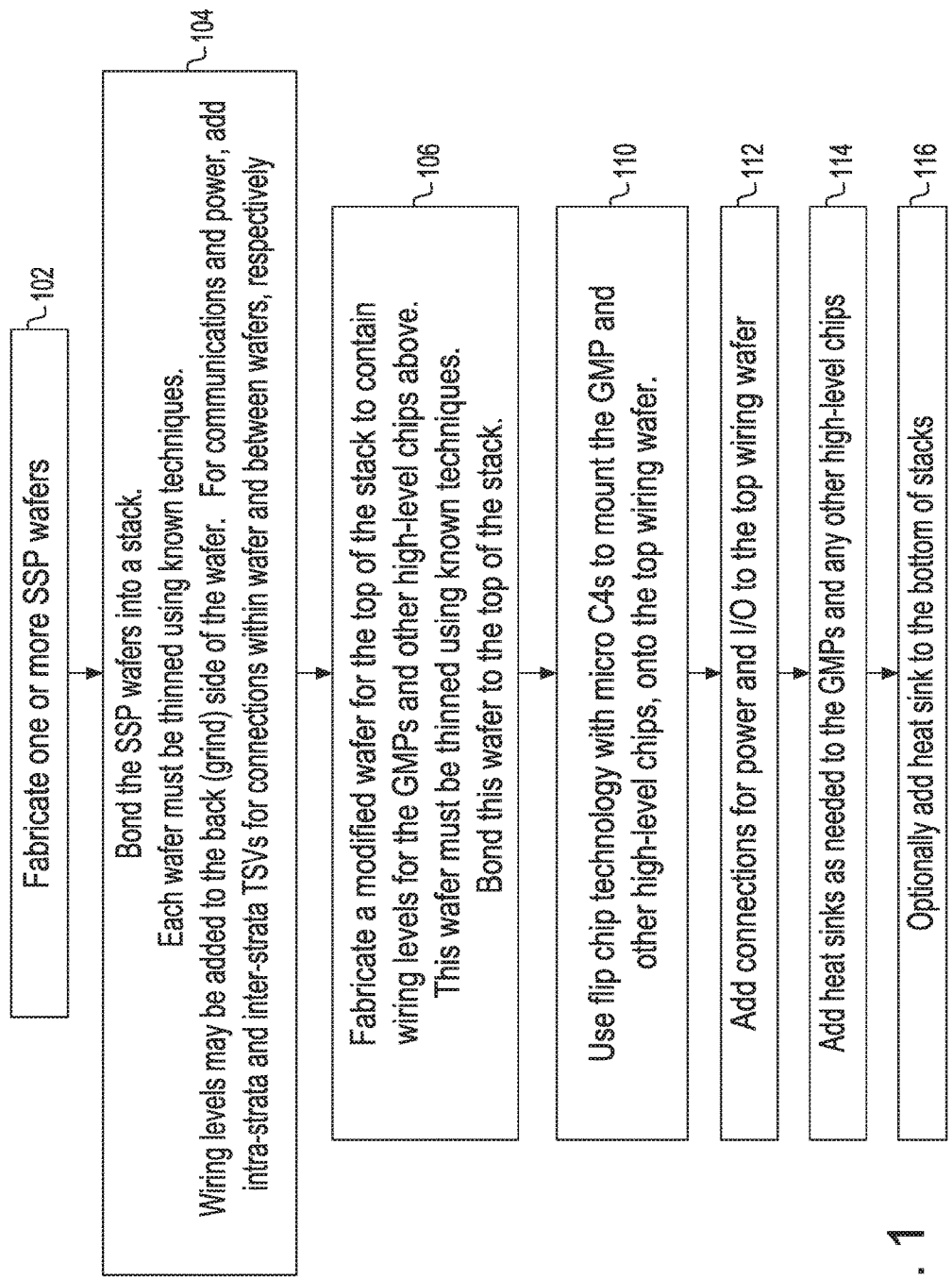
FIG. 1 illustrates a procedure to fabricate a stacked wafer structure in accordance with an embodiment of the invention.

Embodiments of the invention provide a hardware architecture, referred to as a Cortical System, which greatly alleviates the CPU-memory bandwidth problem of conventional computer architectures by transferring much of the memory intensive processing to a battalion of Simple Specialized Processors (SSPs) which are embedded in a large sea of computer memory. These SSPs carry out operations on their domains and then transmit very high level results to a number of General Management Processors (GMPs). The burden of the memory and communications bandwidth is therefore transferred largely to the SSPs. Since the SSPs report very high level results to the BMPs, the bandwidth required for the SSP-to-GMP communication is manageable.

This architecture can be structured in a number of different ways to achieve a Cortical System. In one such embodiment, each GMP except one (called the lead GMP) may control a certain group of SSPs. These GMPs and their associated SSPs can be arranged hierarchically, with the lead GMP at the top. As such, this architecture can be used to implement the model of cortical processing called Hierarchical Temporal Memory (HTM). However, this should not be considered as the only cortical algorithm implementable with the described hardware architecture. Indeed, embodiments of the architecture described herein are generally amenable to fault-tolerant computing applications where extremely high precision and complete accuracy are not required (similar to human brain functioning).

Further embodiments of the invention provide a method to realize a Cortical System. Embodiments of the invention use 3D Wafer Scale Integration (WSI), in which multiple wafers, or strata, are bonded together. In a Cortical System, multiple SSP wafers, each comprised of a large number of SSPs and their associated memory domains, are bonded together to realize a powerful distributed processing system capable of very high agglomerated bandwidth. High density Through Silicon Vias (TSVs) allow for high connectivity within each wafer (intra-strata) and across different wafers (inter-strata).

In embodiments of the invention, GMPs and other high-level chips can be mounted on top of the SSP wafer stack by flip chip bonding to a wiring-level wafer. In alternate embodiments, the SSP wafer stack can be inverted and mounted on a bumped interposer which serves as a wiring level.

Communication between the GMP chips and the underlying SSPs can be done through a communications channel with only medium bandwidth capabilities such as a layer of micro-C4s due to the modest bandwidth requirement, as described above.

3D Wafer Scale Integration is naturally a well-matched hardware structure for implementation of cortical algorithms. Cortical algorithms are naturally fault-tolerant, eliminating one of the fundamental issues with Wafer Scale Integration which renders it impractical for applications where high precision is required. Also, cortical systems are naturally low power due to lower clock speeds, so that heat dissipation in a wafer stack is manageable.

Figure 2:
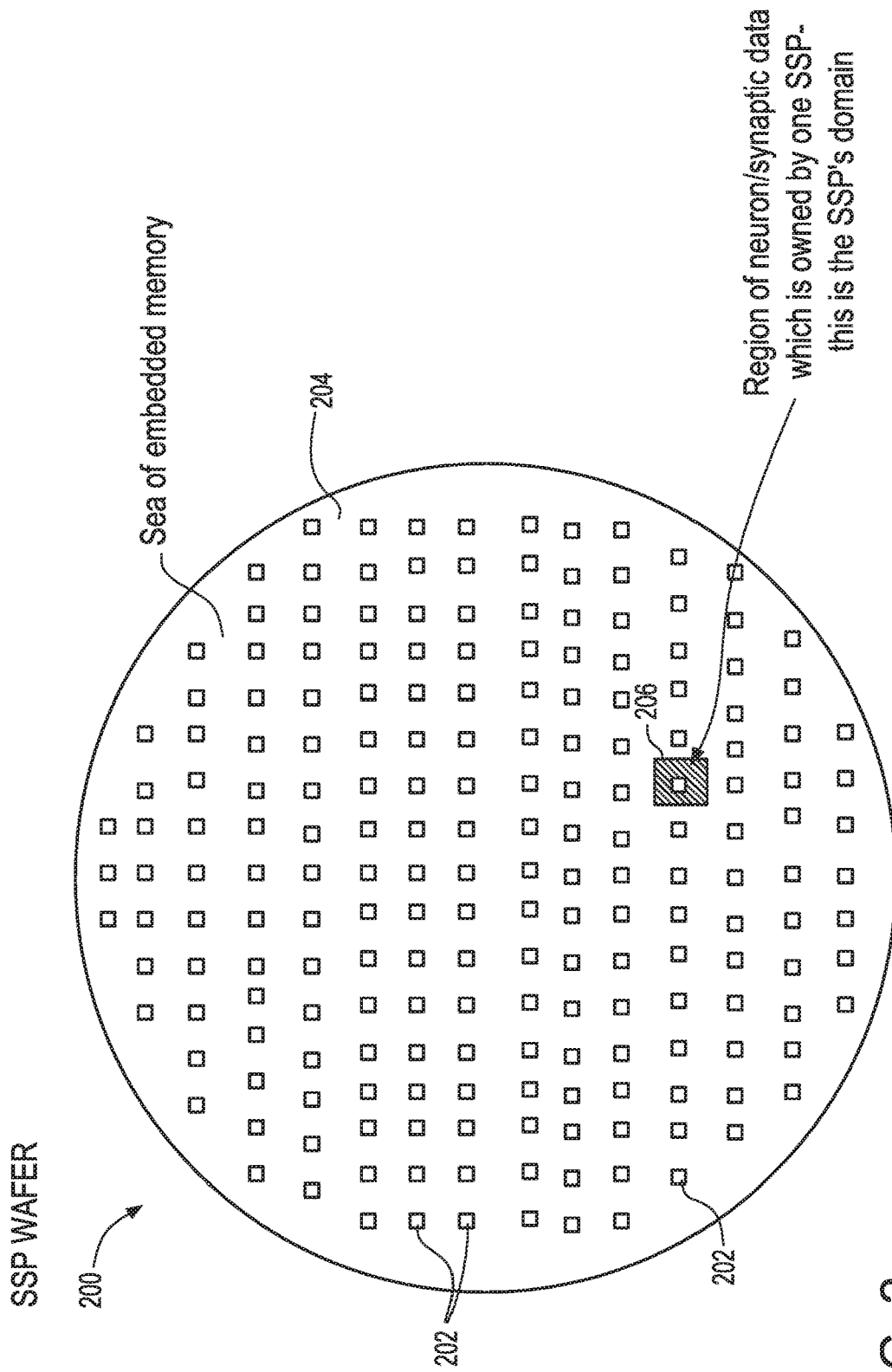
FIG. 2 shows a simple specialized processor (SSP) wafer that may be used in the procedure of FIG. 1.

FIG. 1 illustrates a procedure 100 to fabricate a cortical system in accordance with an embodiment of the invention. Step 102 is to fabricate one or more SSP wafers, and a SSP wafer is shown in FIG. 2 and discussed below in more detail. Step 104 is to bond the SSP wafers into a stack using, for example, the method shown in FIG. 3, also discussed below in more detail. Each wafer is thinned, and this may be done using known techniques, and wiring levels may be added to the back (grind) side of the wafer. For communications and power, intra-strata and inter-strata TSVs may be added for connections within wafers and between wafers, respectively.

Figure 4:
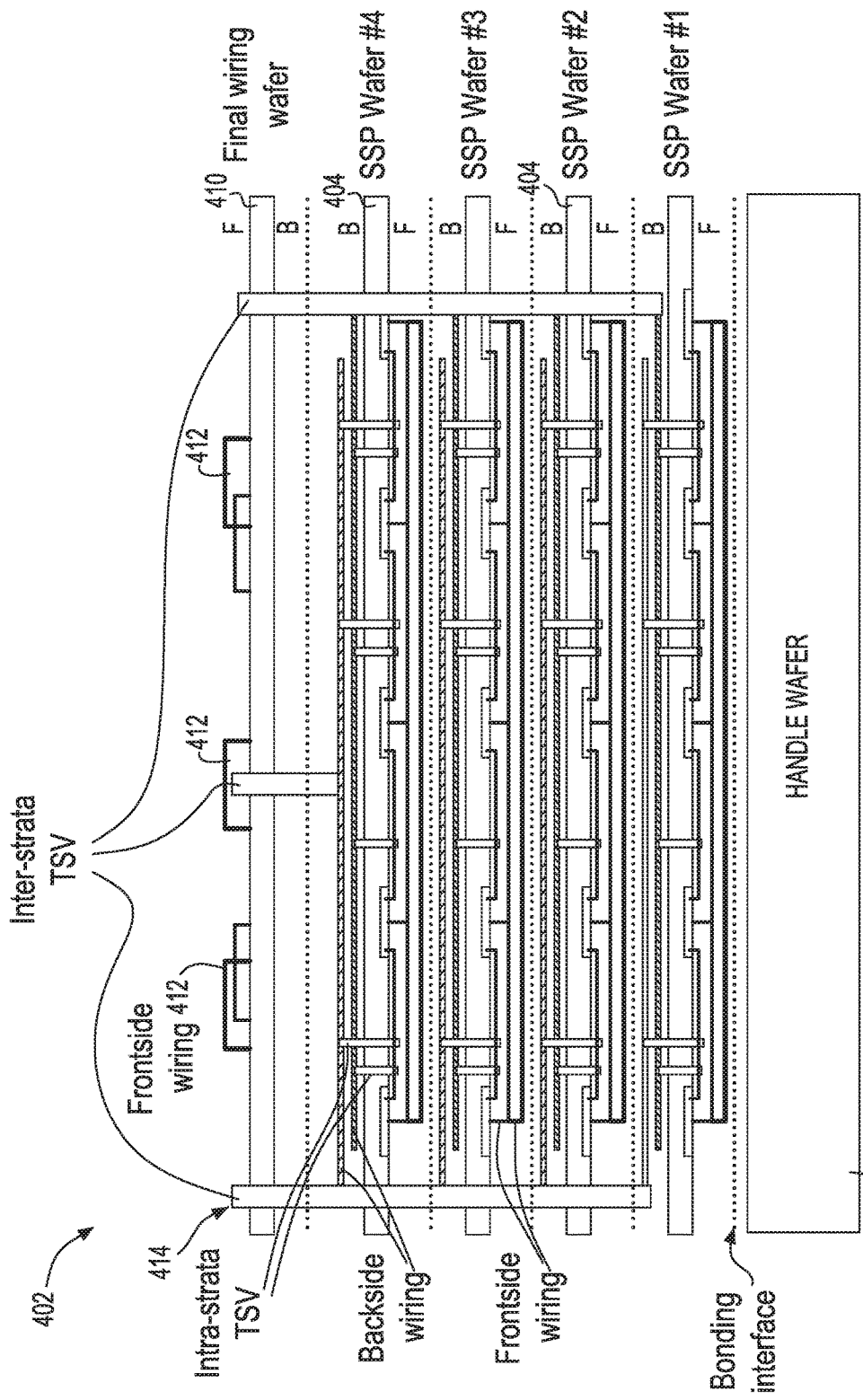
FIG. 4 illustrates the 3D wafer scale integration of SSP wafers and a final wiring wafer in the procedure of FIG. 1.

At step 106, a modified wafer is fabricated for the top of the stack to contain wiring levels for the GMPs and other high-level chips. This wafer is also thinned using, for instance, known techniques, and this wafer is bonded to the top of the stack. A stack of wafers at this stage is shown in FIG. 4.

Figure 8:
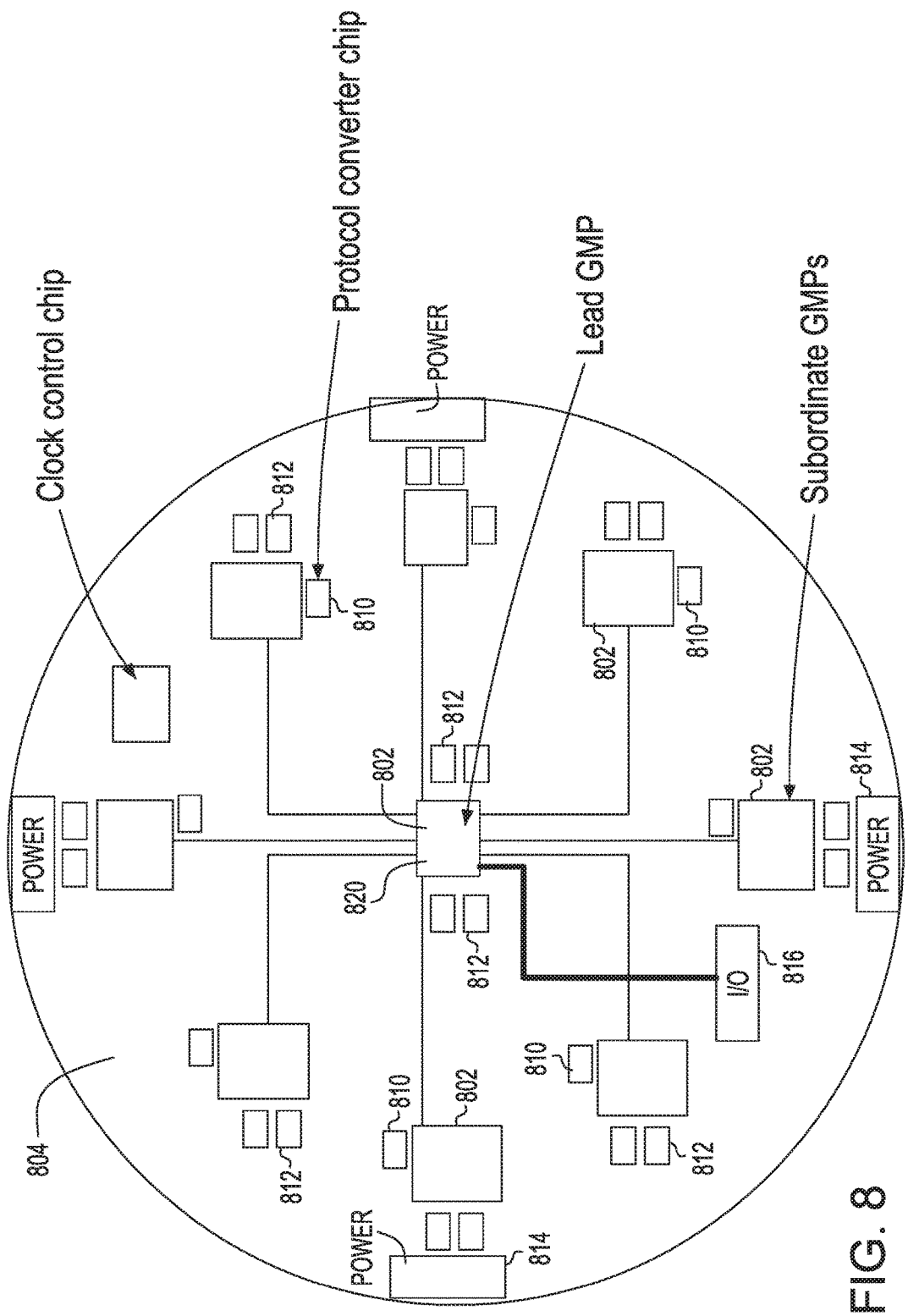
FIG. 8 depicts the general management processors and other high level chips of the structure of FIG. 4.

At step 110, flip chip technology is used with micro C4s to mount the GMP and other high-level chips, shown in FIG. 8, onto the top wiring wafer. Connections for power and I/O are added, at step 112, to the top wiring wafer. At step 114, heat sinks are added as needed to the GMPs and any other high-level chips; and at step 116, a heat sink is optionally added to the bottom of the stack.

Figure 9:
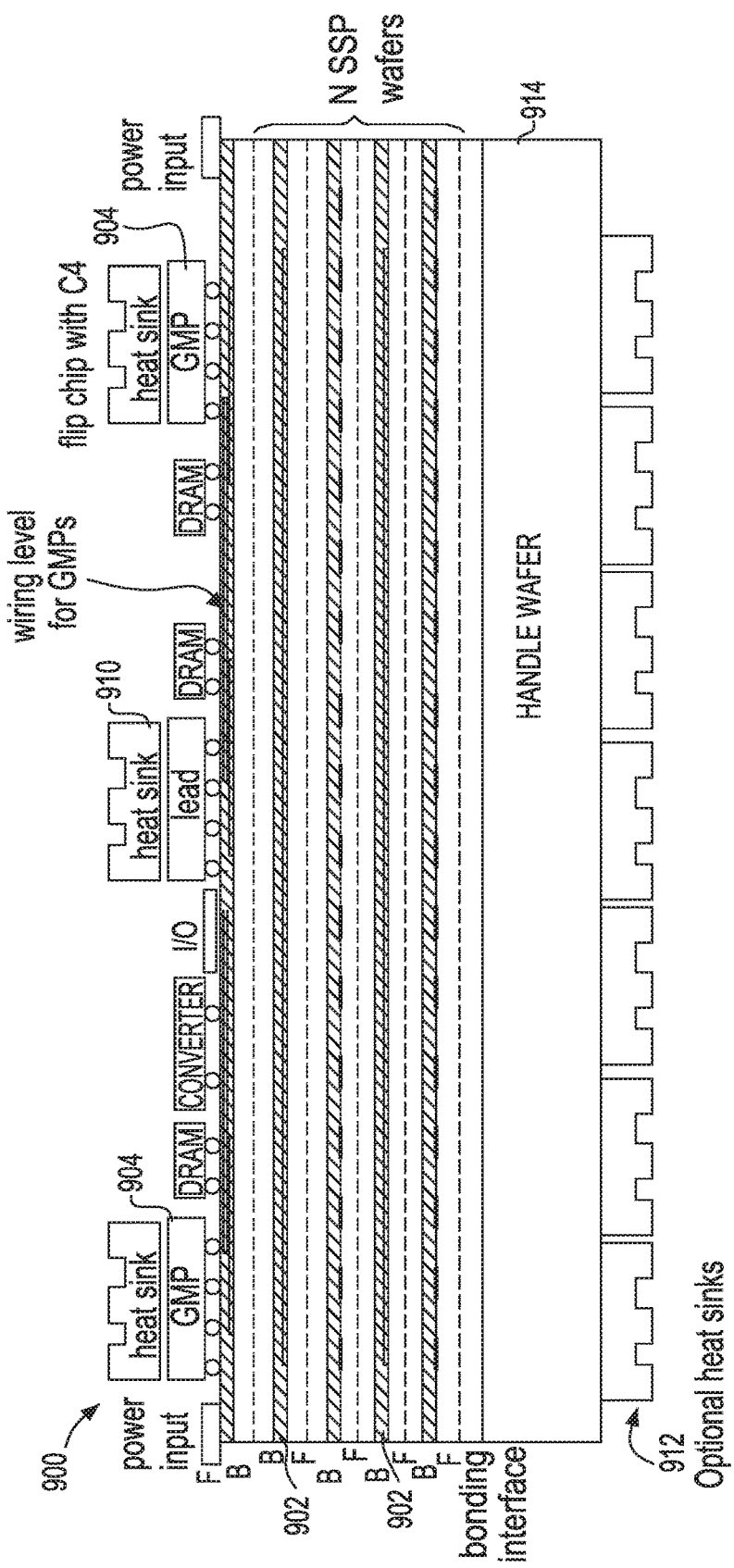
FIG. 9 provides another view of a stacked wafer structure in accordance with an embodiment of the invention.
Figure 10:
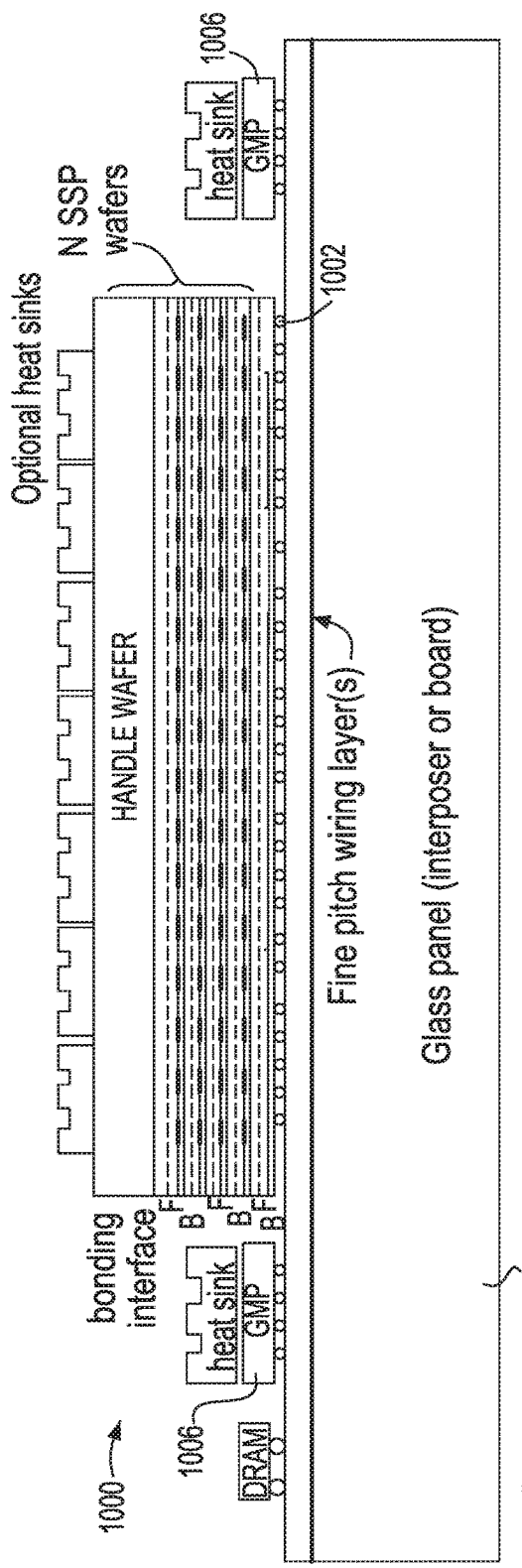
FIG. 10 shows an alternate stacked wafer structure in accordance with an embodiment of the invention.

One embodiment of the final assembled stack is shown in FIG. 9. An alternate embodiment is shown in FIG. 10.

FIG. 2 shows an SSP wafer 200. In this wafer, a battalion of simple specialized processors (SSPs) 202 are embedded in a large sea of computer memory 204. Memory 204 may comprise any suitable amount and type of memory. For example, the embedded memory, may be in the range of 30-300 GB per wafer, and, in embodiments of the invention, may be embedded DRAM, DRAM, or SRAM.

The SSPs carry out simple operations on their domains 206 and then transmit very high level results to a small number of General Management Processors (GMPs). Each SSP is associated with a memory domain, one of which is shown at 206, and in an embodiment, each SSP is associated with a respective one memory domain. The SSPs may number between approximately 100-1000 per wafer. Each SSP is a specialized simple micro processor to execute certain memory primitives for memory in its vicinity (domain). The SSPs are referred to as specialized because they are used for a limited number of functions. Any suitable processor may be used in embodiments of the invention as an SSP, and suitable processors are known in the art.

Examples of SSP jobs include: find largest or smallest element in domain; multiply matrix or vector by constant; matrix-matrix, matrix-vector, vector-vector products; fill the domain with random numbers. The SSP also has router/buffer capabilities, discussed below. Each memory domain is a region of neuron/synaptic data which is owned by one SSP—this is the SSP's domain.

Figure 3:
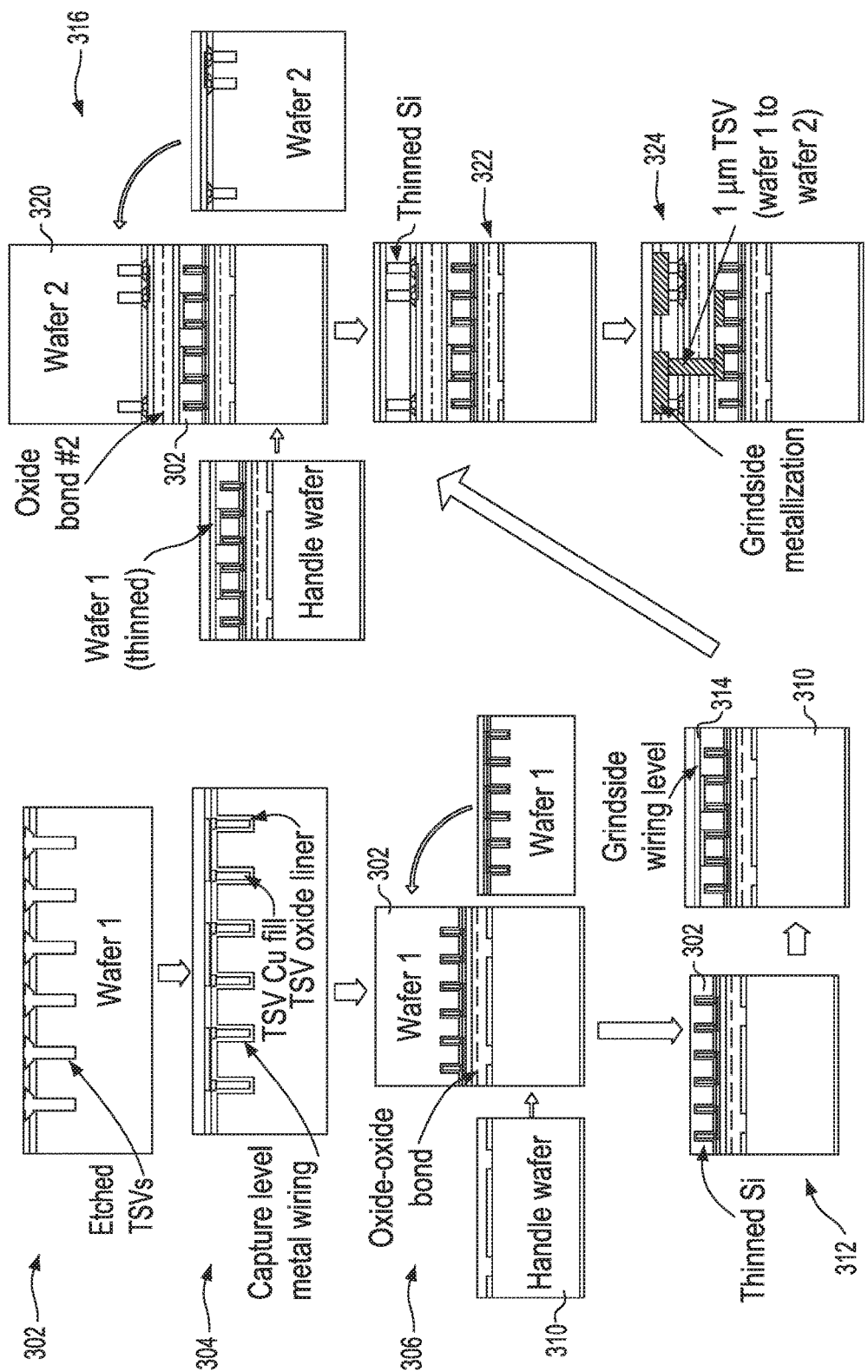
FIG. 3 depicts a process flow for wafer-to-wafer bonding that may be used in the fabrication procedure of FIG. 1.

FIG. 3 illustrates, as an example, a process flow for wafer-to-wafer bonding. In this process, multiple wafers, or strata, are bonded together. Multiple SSP wafers, each comprised of a large number of SSPs and their associated memory domains, are bonded together. High density Through Silicon Vias (TSVs) allow for high connectivity within each wafer (intra-strata) and across different wafers (inter strata). GMPs and other high level chips can be mounted on top of the SSP wafer stack by flip chip bonding to a wiring-level wafer.

In FIG. 3, an SSP wafer including etched TSVs is shown at 302. As illustrated at 304, the TSVs are provided with an oxide liner and a Cu fill, and a wiring level is added. As shown at 306, the wafer 302 is positioned, or flipped, onto a handle wafer 310; and as represented at 312, the wafer is thinned, for example, to five um. A wiring level 314 may be added to the grind side of the wafer 302.

As shown at 316, additional wafers 320 may be added onto wafer 302, and for example, an oxide-oxide bond may be used to bond together adjacent wafers. Each additional wafer may be provided with the desired wiring levels, and ground to the desired thickness, as represented at 322. As illustrated at 324, grindside metallization and other process steps may be used to add intra-strata and inter-strata TSVs for connections within wafer and between wafers, respectively.

The integration scheme shown in FIG. 3 is presented as an example. Other processes may be used in embodiments of the invention.

FIG. 4 shows a stack 402 of wafers in accordance with an embodiment of the invention. This stack comprises four SSP wafers 404, of the type shown in FIG. 2, on top of a handle wafer 406, and a top wiring wafer 410. In this embodiment, the top wafer 410 is mounted on top of the SSP wafer stack and is bonded to that stack, and the GMPs 412 and other high level chips are bonded by flip chip bonding to the wiring-level wafer. The bottom SSP wafer is bonded to the handle wafer 406 via a bonding interface.

Frontside wiring 414 on the final wiring wafer 410 is used, for example, to provide GMP-to-GMP communications. Communications between the GMP chips and the underlying SSPs can be done through a communication channel with only medium bandwidth capabilities such as a layer of micro C4s due to the modest bandwidth requirements, as discussed above. Inter-strata TSVs are used, for instance, for communication from GMP level to SSP level, and for connections to power and ground within the stack.

In the stack of FIG. 4, adjacent SSP wafers are placed back-to-front—that is, the back side of one of the adjacent wafers faces the front side of the other of the adjacent wafers. Backside wiring on the SSP wafer may be used, for example, to provide power and ground. Frontside wiring on the SSP wafer may be used, for instance, for SSP-SSP communication.

The above-described wiring scheme is general, and many other suitable schemes may be used in embodiments of the invention. Also, for instance, in embodiments of the invention, backside wiring is optional, and power/ground can also be distributed on the front.

The stack shown in FIG. 4 comprises four SSP wafers. It may be noted that the stack can be general to N SSP wafers, and have more or fewer SSP wafers than is shown in FIG. 4.

Figure 5:
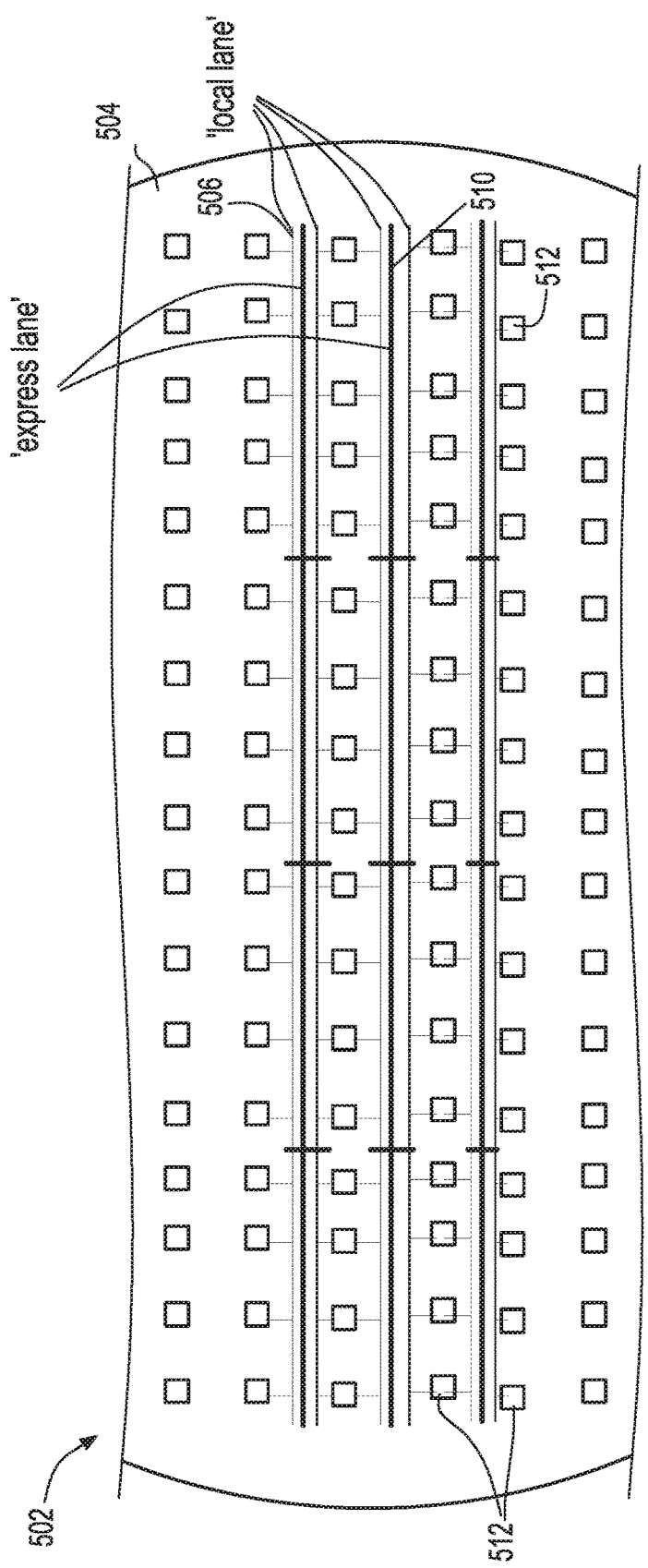
FIG. 5 shows one use of frontside wiring levels on SSP wafers.

FIG. 5 shows, as an example, a use of frontside wiring levels 502 on an SSP wafer 504. Typically, four or more wiring levels may be used on the front side. These can be used for local lane 506 and express lane 510 connections between SSPs 512. The local lanes are connected to each of the SSPs along their paths, and the express lanes are connected to adjacent local lanes at selected points along their lengths. FIG. 5 shows local and express connections in the horizontal direction; analogous connections can be made in the vertical direction.

With the arrangement shown in FIG. 5, to transmit a data packet from one SSP to another SSP, the data packet may be sent first to a local lane directly connected to the former SSP, and then to an express lane connected to that local lane. The data packet may be transmitted along that express lane until the packet reaches the vicinity of its destination SSP. The data packet may then be transferred to a local lane, and from there, to the destination SSP.

Figure 7:
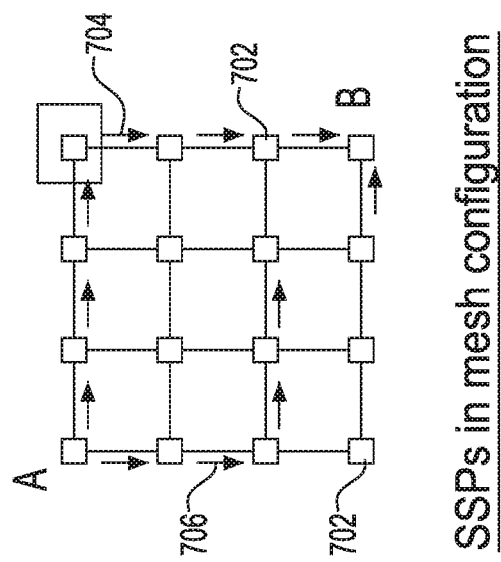
FIG. 7 shows routing schemes that may be used on an SSP wafer.
Figure 6:
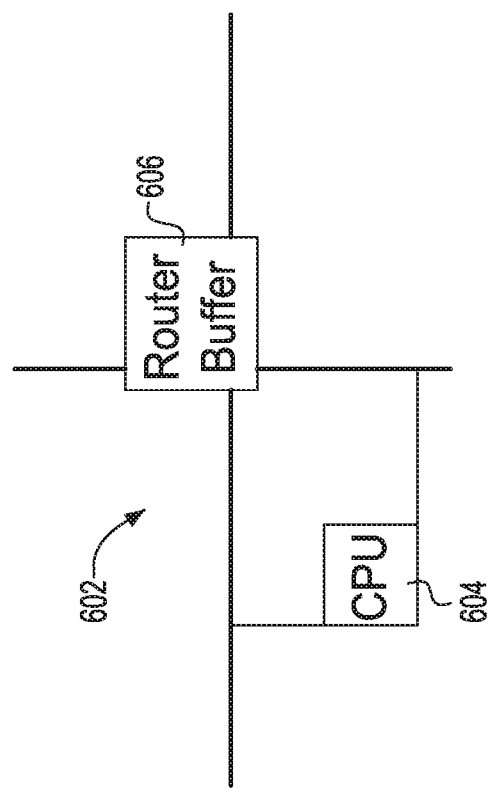
FIG. 6 shows an SSP with a CPU and a routing buffer.

FIGS. 6 and 7 illustrate routing on an SSP wafer. FIG. 6 shows an SSP 602 including a CPU 604 and a router/buffer 606. FIG. 7 shows different routes between SSPs 702. In an embodiment of the invention, the SSPs are arranged in a mesh configuration, and each SSP includes a router/buffer. Information request packets and data packets can be sent from one SSP to another SSP either using (1) a deterministic routing scheme 704, such as first move fully in the x-direction, then fully in the y-direction, then fully in the z-direction, or (2) a stochastic routing scheme 706 which would randomly assign a routing path.

FIG. 8 shows GMPs 802 bonded on a wiring wafer 804. As shown in FIG. 8, a plurality of GMPs and other high level chips are bonded to the wiring wafer. These other high level chips include a clock control chip 806, protocol converter chips 810, and, optionally, memory chips 812. FIG. 8 also shows power supplies 814 and I/O connections 816. One of the GMPs is selected as the lead GMP 820, and the other GMPs are referred to as subordinate GMPs. Each GMP is associated with one of the protocol converter chips 810. In embodiments of the invention, memory chips bonded to the wiring wafer are optional.

The GMPs 802 are high performance processors. Any suitable processor may be used as a GMP, and suitable processors are known in the art. The lead GMP communicates with the other, subordinate GMPs and with external I/O connections 816. The subordinate GMPs communicate with SSPs, and the protocol converter chips allow SSPs to talk to the GMP chips. Also, any suitable memory chips 812 or devices may be used in embodiments of the invention; and for example, memory chips 812 may be DRAMs or other suitable memory chips in the range of 4-128 GB.

FIG. 9 provides a view of a chip stack 900 in accordance with an embodiment of the invention. In this view, wiring levels and vias are omitted for clarity.

As shown in FIG. 9, the SSP wafers 902 are frontside (F) down, grindside (B) up. The GMPs 904 are flip chip mounted atop the top wafer with, in one embodiment, wiring level, frontside up. Inter-strata TSVs are provided for power/ground and vertical SSP-SSP communication. Frontside wiring levels are used for SSP-to-SSP communication within the wafer, in one embodiment, but also for local distribution of power and ground.

Backside wiring levels are optional in embodiments of the invention. Backside wiring levels may be used for power and ground, in an embodiment, but may also be used for SSP-to-SSP communications. SSP-to-GMP communication may be done through protocol converter chips 906 which use micro C4s and inter-strata TSVs to communicate with SSPs. Heat sinks 910 may be added atop the high power chips on top of the stack. Optional heat sinks 912 may be provided at the bottom of the handle wafer 914.

Figure 11:
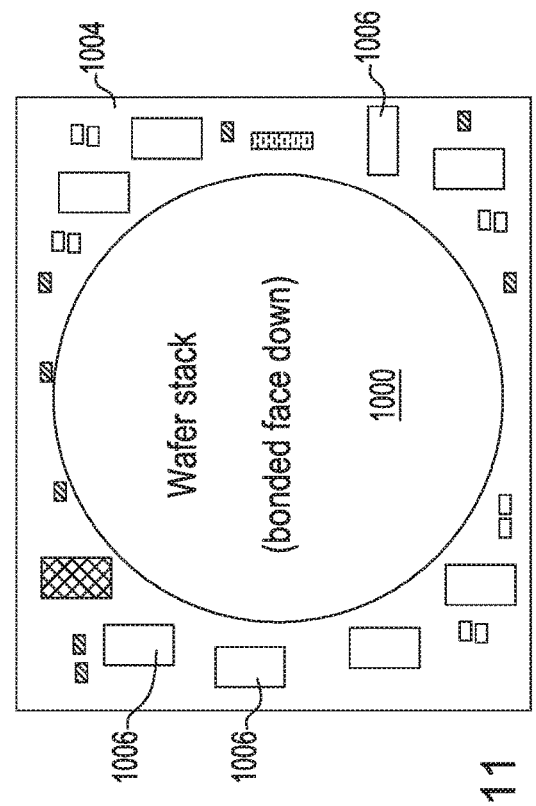
FIG. 11 is a top view of the wafer stack of FIG. 10.

FIGS. 10 and 11 show an alternate embodiment of a wafer stack 1000. This stack is similar to the stack of FIG. 9, except that the stack of FIG. 10 is provided with bump connections 1002, and the stack is flipped upside down and mounted on a bumped interposer 1004. For example, a glass interposer board can be used, where a goal is to do fine pitch wiring on large glass panels. GMPs 1006 and other chips may also be mounted on the interposer board 1004, outside stack 1000. This embodiment offers the additional advantage of allowing multiple wafer stacks to be mounted on the interposer board.

Figure 12:
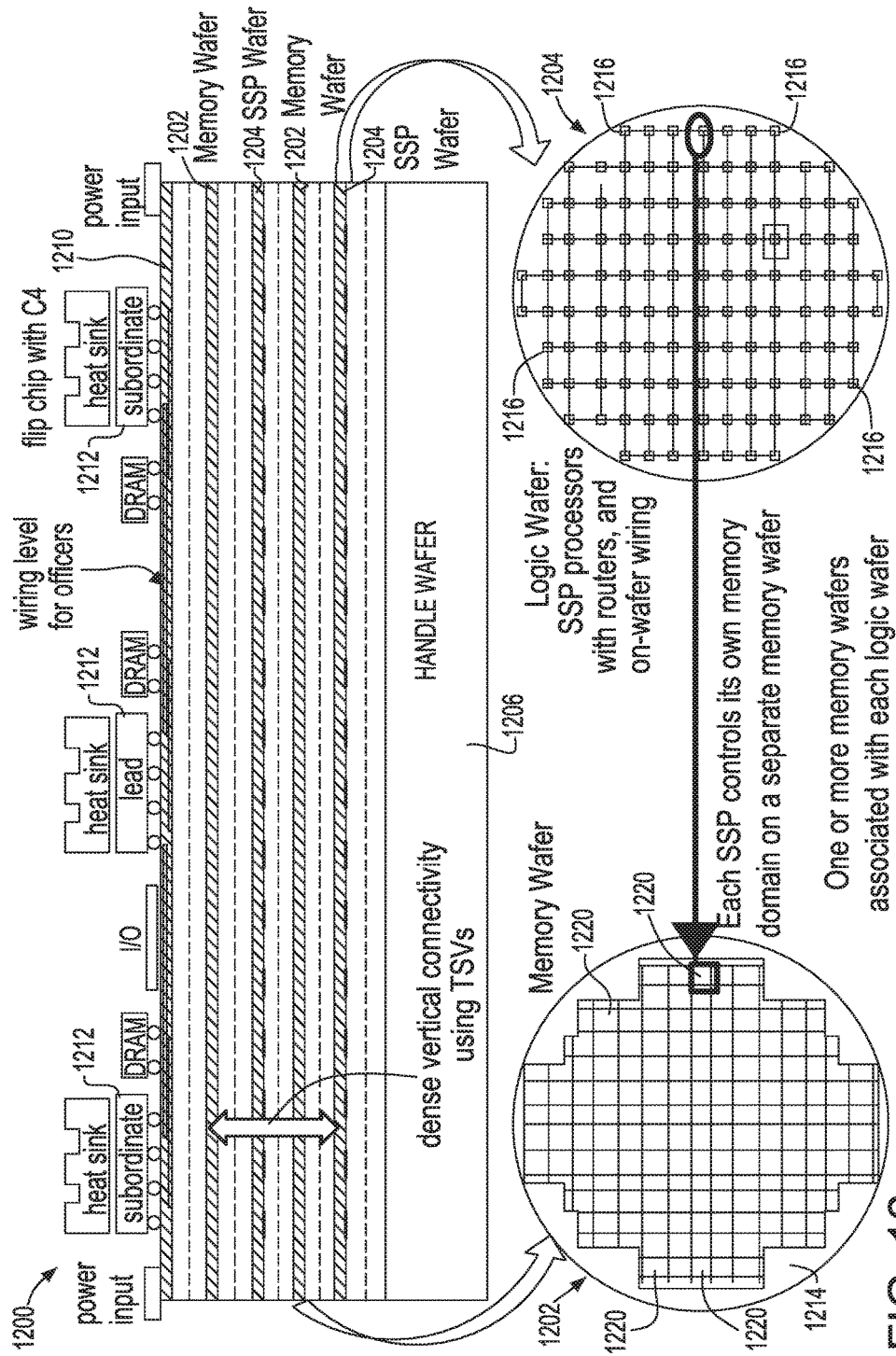
FIG. 12 illustrates an alternate stacked-wafer structure comprising separate memory wafers and logic wafers.

FIG. 12 illustrates an alternate embodiment in which memory is separated from the logic wafers. More specifically, FIG. 12 shows a wafer stack 1200 comprised of a plurality of memory wafers 1202 and a plurality of SSP wafers 1204. FIG. 12 also shows a handle wafer 1206, a top wiring wafer 1210, and a plurality of General Management Processors 1212.

Each memory wafer 1202 includes a memory area 1214, and each of the processor wafers 1204 has a multitude of SSPs 1216 embedded in the wafer. Each SSP 1216 controls an associated memory domain 1220 on a separate memory wafer 1202, and one or more memory wafers 1202 may be associated with each logic wafer 1204. In the embodiment of FIG. 12, the memory wafers 1202 and the processor wafers 1204 alternate in the stack 1200, and TSVs are used to obtain the desired vertical connectivity between the wafers.

Frontside wiring (not shown) on each of the processor wafers 1204 may be used for SSP-SSP communications. Backside wiring (not shown) on the SSP wafers 1204 may be used to provide power and ground.

As shown in FIG. 12, the memory wafers 1202 and the logic wafers 1204 are mounted on the handle wafer 1206. The top wafer 1210 is mounted on top of the stack of the memory and logic wafers, and the GMPs 1212 and other high level chips are bonded by flip chip bonding to the wiring level wafer. These other high level chips may include a clock control chip, protocol converter chips, and memory chips. Power supplies and I/O connections may also be mounted on the wiring level wafer. Heat sinks may be mounted on the general management processors.

Figure 13:
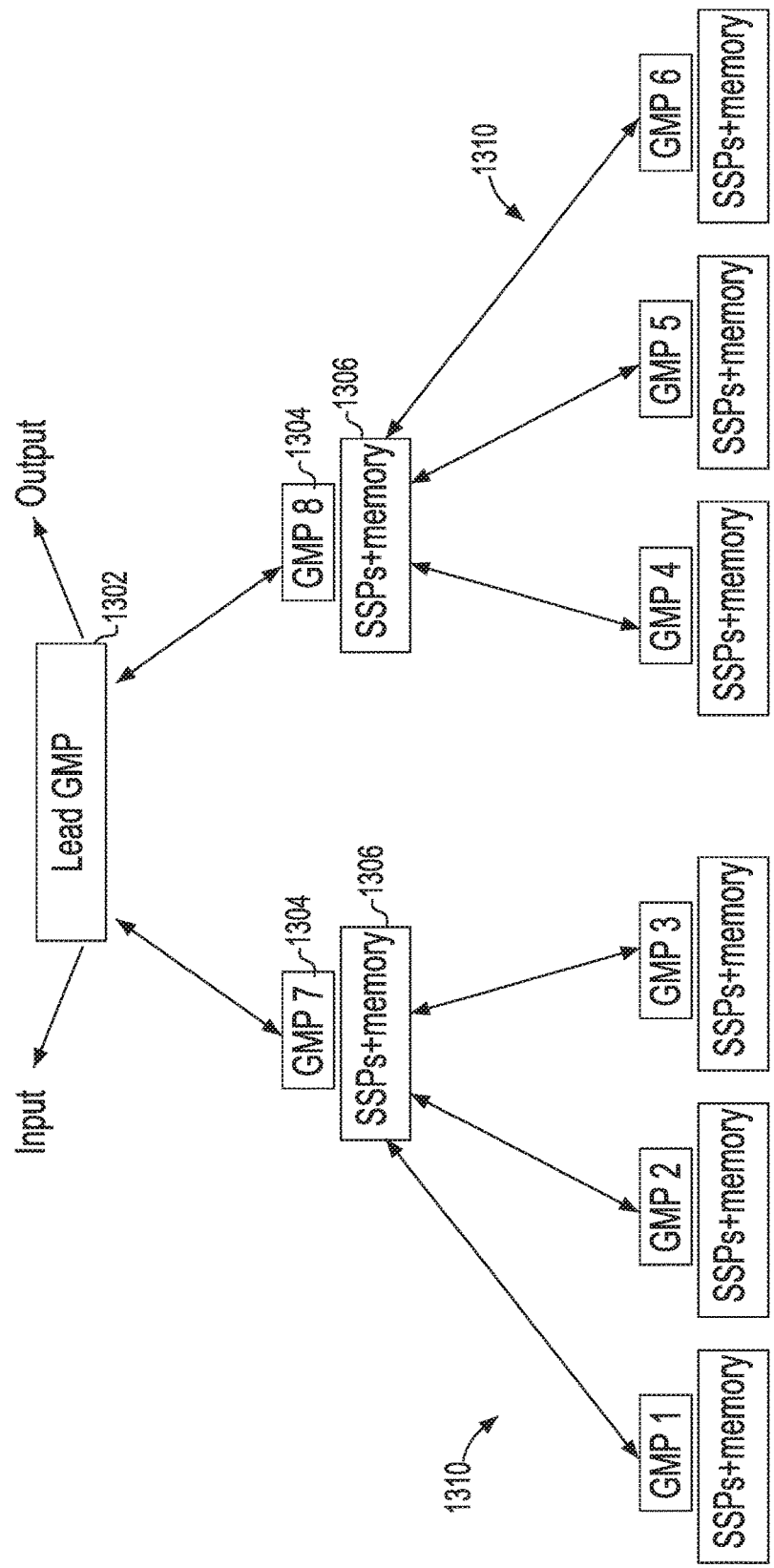
FIG. 13 shows one example of a hierarchical architecture realizable with embodiments of this invention.

One example of a hierarchical architecture realizable with embodiments of the invention is shown in FIG. 13. In this architecture, the lead GMP 1302 is at the top of the hierarchy and communicates directly with two of the subordinate GMPs 1304. Each of these GMPs communicates directly with a set of the SSPs 1306, and each of these GMP/SSP groups communicates with three other GMP/SSP groups 1310.

Embodiments of the invention provide fault tolerance. In WSI, faults are inevitable, but can be routed around. If defective sites are identified in a wafer or a stack, fault tolerance become a routing problem—and algorithms exist for deadlock-free routing around faults in 2-dimensional meshes.

An optimized routing algorithm for this application can be developed. Such an algorithm may include a routine to send a packet in a general direction followed by a routine which has a method to reach an SSP in its local vicinity.

Each packet sent out should be followed by an acknowledgement handshake sent by the receiver. If that acknowledgement is not received by the sender, the sender should resend using a different path.

Figure 17:
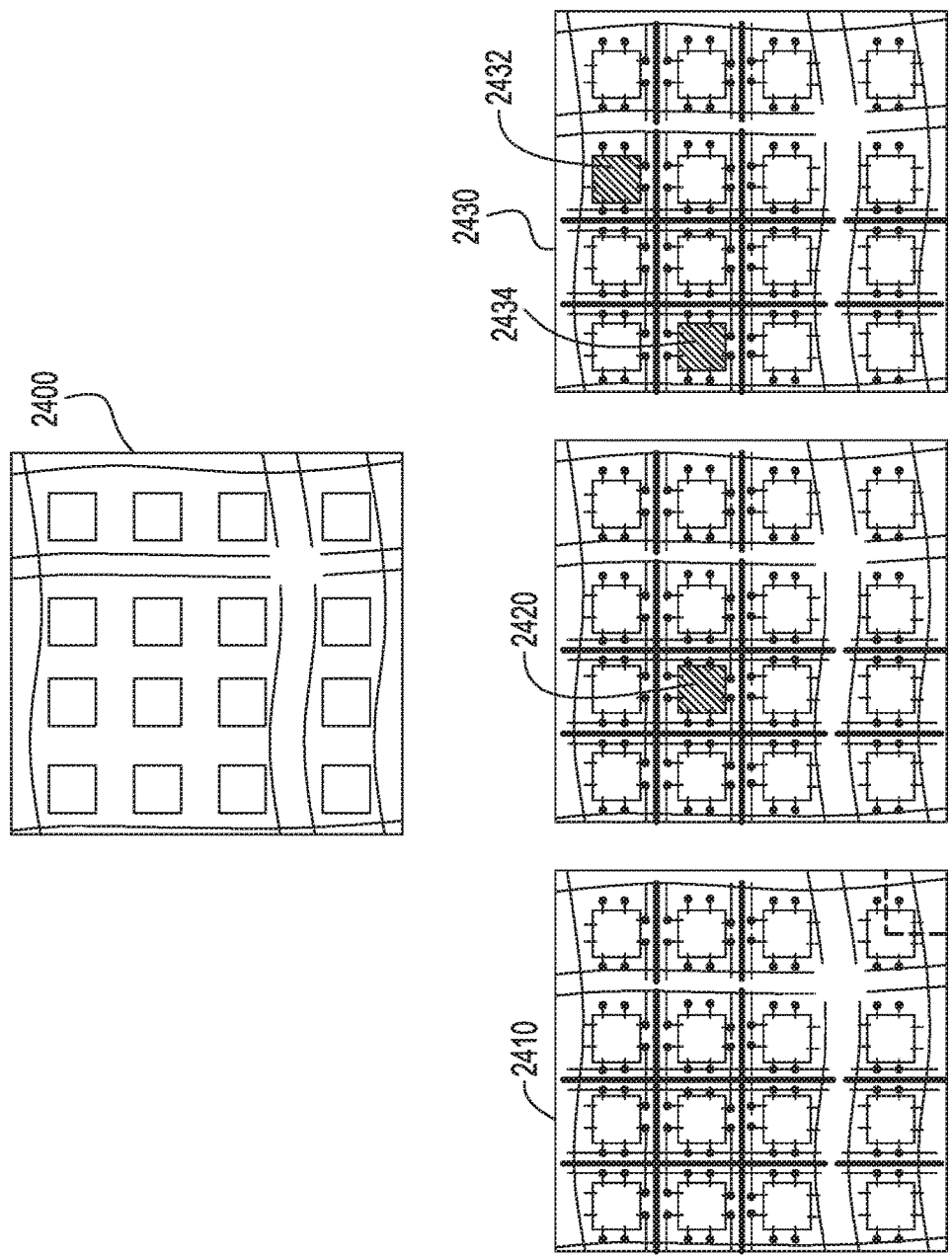
FIG. 17 illustrates an adaptive wiring that allows isolation of defective SSPs

Part of system testing/initialization may include having the GMPs send test signals to each SSP to determine the defective ones and create a set of routing instructions. It is also possible to stitch over defective sites. This is shown in FIG. 17, discussed below.

Cortical algorithms are highly resilient. Simulations have shown that even if 50% of columns in an HTM-like model are suddenly destroyed, the system rebounds and is still able to give acceptable results. Part of the reasons for this is that exact or perfect answers are not demanded from a cortical system.

As a result, cortical systems, in embodiments of the invention, can be initially wired with certain faults present;

and even if those areas do not function properly, the cortical system can train itself by avoiding those regions and still give acceptable results.

Figure 14:
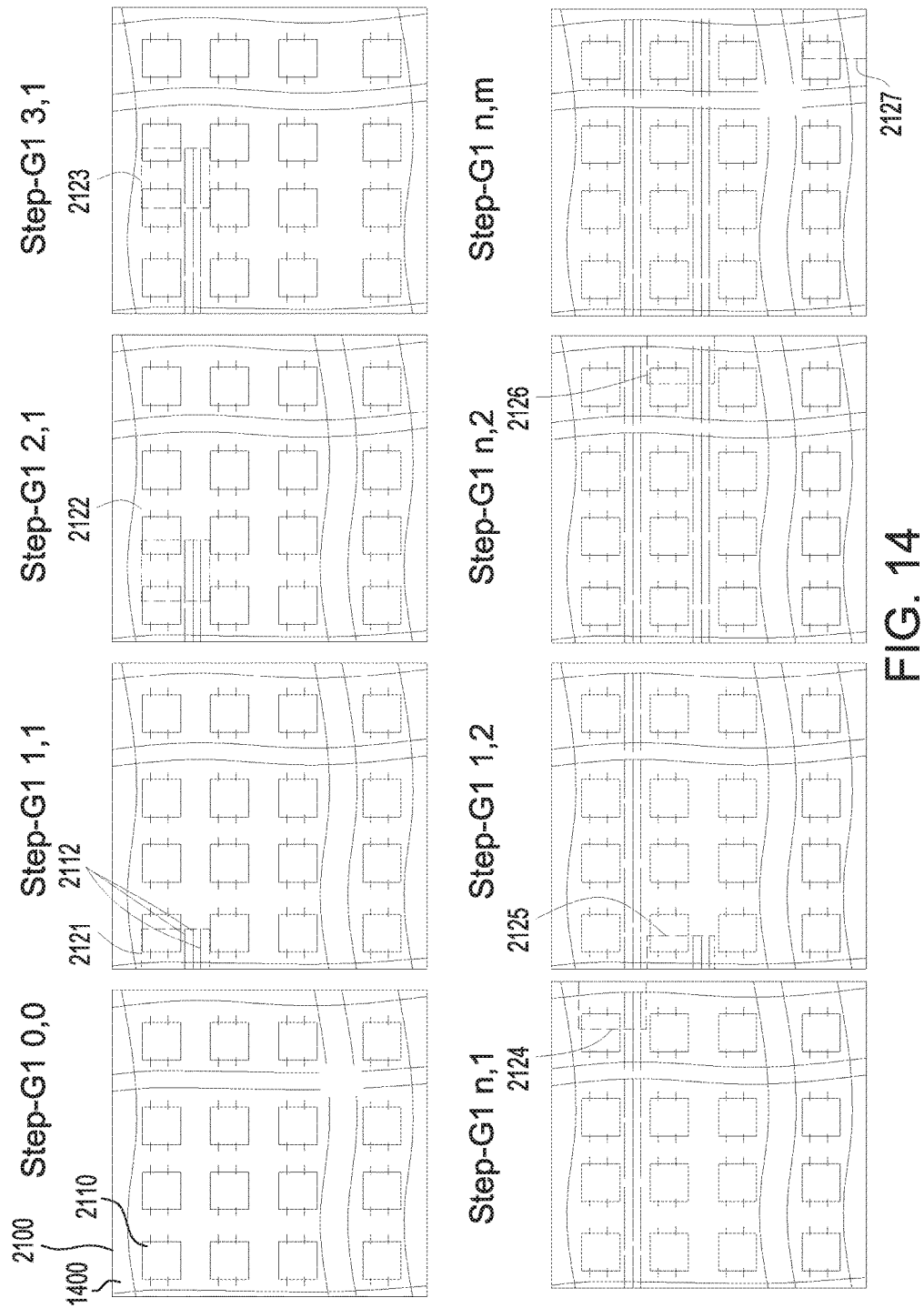
FIG. 14 illustrates a procedure for forming a first wiring layer on an SSP wafer.

As discussed above, the SSP wafer comprises a plurality of SSP units. FIGS. 14-17 show methods to create local and express data lanes in the wafer to couple the SSPs using two FAT metal layers, G1 and G2, and VIAs connecting between G1 and G2. Referring to FIG. 14, SSP wafer 1400 comprises a plurality of SSP units 2110. For simplicity, this Fig. shows the SSPs arranged in n rows and m columns, however the actual SSP arrangement may be different and any suitable arrangement of SSPs may be used. The process step G1 0,0 is a conventional VLSI manufacturing step flow a using common SSP mask to create n×m SSPs. As mentioned above, known SSPs may be used in embodiments of the invention.

After the step G1 0,0, the G1 wiring process starts for the first SSP. This process creates G1 metal wires (2112, where two of wires adjacent to the SSP are the local lanes, and the FAT wire is the express lane) in the VLSI mask window of 2121 as shown in the step-G1 1,1. The mask is then stepped to the next adjacent SSP, and creates the G1 wires in the window of 2122 in the step-G1 2,1.

Any suitable stepping lithography process in a mask window may be used, and for example, in embodiments of the invention, the process may be a conventional process used for a conventional VLSI chip.

This process continues to until the last SSP units using the steps-G1 i,j, (1=1-n, and j=1,m). These steps complete the G1 process using one common G1 mask set 2112.

It may be noted that the mask used for the step-G1,i,j is one common G1 mask, and the stepping size is the same as the SSP stepping size used for individual SSP units in a wafer.

Figure 15:
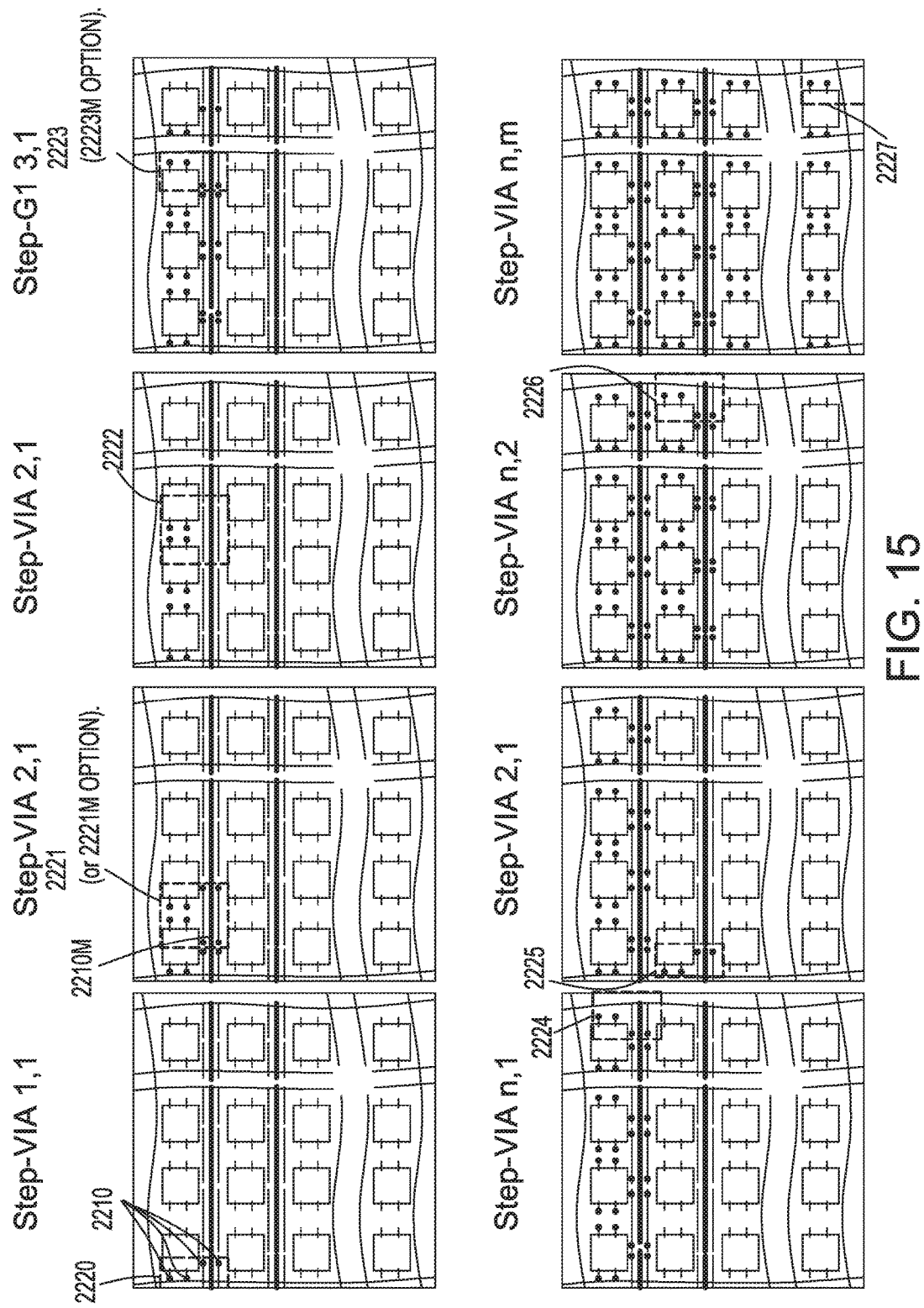
FIG. 15 shows a procedure for forming VIAS in an SSP wafer.

After the G1 process, the VIA process, illustrated in FIG. 15, starts using VIA mask 2210. Step-VIA 1,1 creates VIAs 2210 in the mask window 2220. The mask is then stepped to the next adjacent SSP, and creates the VIAs in the window of 2221 in the step-VIA 2,1. Similar to the G1 wiring process, this VIA process continues to until the last SSP units using the steps-VIA i,j (i=1-n, and j=1,m). These steps complete the VIA process using one common 2221 mask set. Note that the stepping size is the same as the SSP stepping size used for individual SSP units in a wafer.

Optionally, the VIAs for the express lanes can be built using a modified mask 2221M as shown in Step-VIA 2,1 and Step VIA 3,1. When an express lane VIA is used, all the VIAs without having express lanes may be built in all the wafers using the first mask set; and then using the second mask set, the VIAs for the express lanes may be built. Optionally, an additional mask may be used for further express bus customization.

Figure 16:
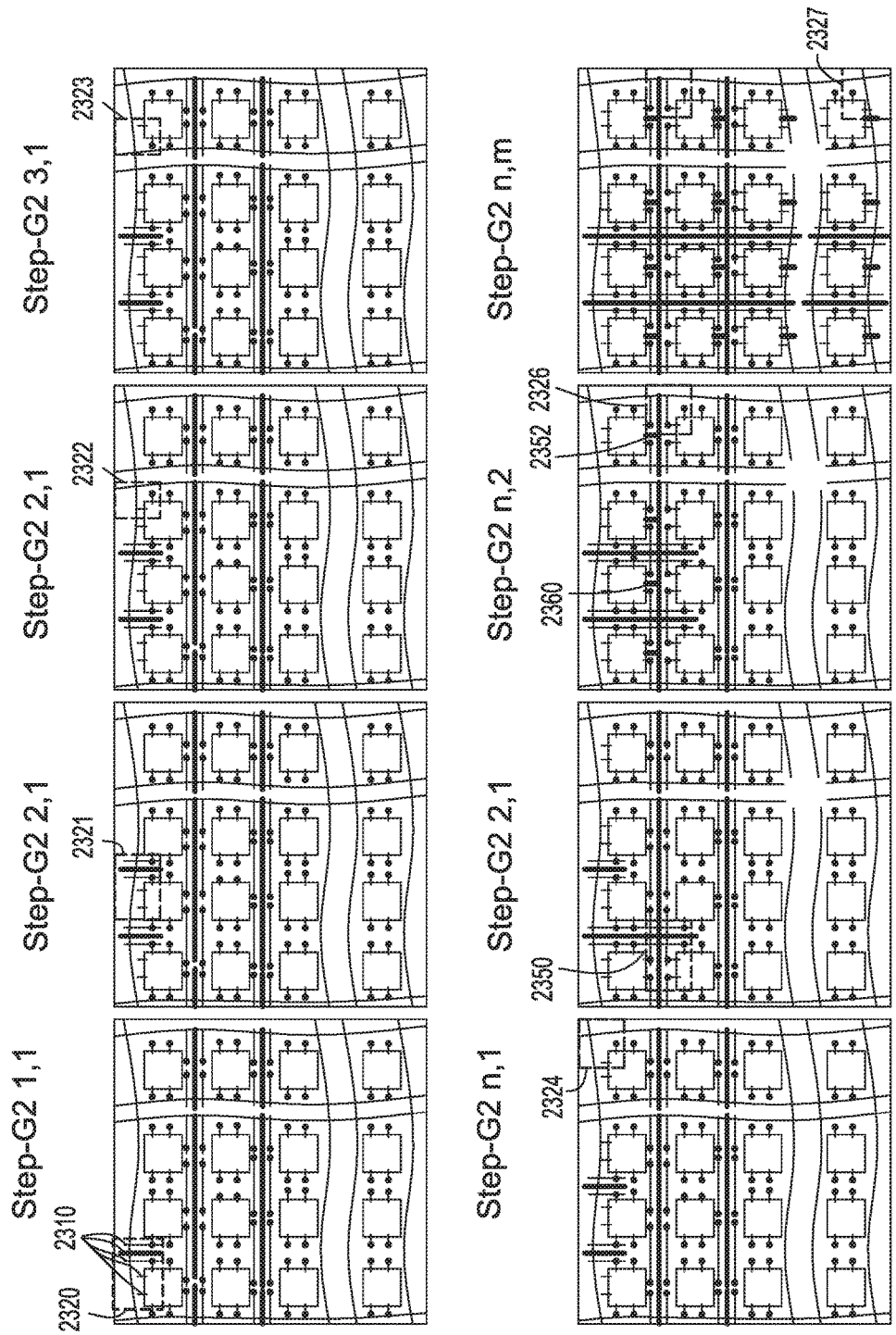
FIG. 16 shows a procedure for forming a second wiring layer on an SSP wafer.

Similar to the G1 and VIA processes, referring to FIG. 16, G2 wires are built using the steps-G2 i,j (i=1-n, m=1,m) using one common G2 mask set.

The process steps shown in FIGS. 14-16 allow all SSPs in a wafer to be connected to at least adjacent SSPs using local lanes, with the optional long SSP communication using the corresponding express lanes.

This adaptive segmented stitching approach allows isolation of the defective SSPs as shown in FIG. 17.

With reference to FIG. 17, prior to creating the stitching for the SSPs (2400), each SSP may be tested. If all the SSPs are good (2410), all the SSPs are stitched as discussed in the flows of FIGS. 14-16. If an SSP (2420) is bad, the VIA process of 2420 is skipped. This results in isolating the defective SSPs from other SSPs. Similarly, if SSPs (2432 and 2434) are defective, the VIA process for these SSPs is skipped.

While several embodiments of the invention have been specifically disclosed herein, it will be appreciated that numerous modifications and embodiments of the invention may be devised by those skilled in the art, and it is intended that the appended claims cover all such modifications and embodiments as fall within the true spirit and scope of the present invention.

The invention claimed is:

1. A stacked-wafer processor-memory system comprising:
a plurality of specialized processor wafers arranged in a stack, each of the specialized processor wafers comprising a memory area and a multitude of specialized processors embedded in the memory area of the each specialized processor wafer, and each of the specialized processors performing a specified set of operations using a respective one associated memory domain of the memory area of the each specialized processor wafer;
an input/output connection;
a plurality of subordinate general management processors, each of the subordinate general management processors connected to an associated set of the specialized processors; and
a lead general management processor in communication with the input/output connection and with the subordinate general management processors for transmitting data to and receiving data from the subordinate general management processors;
a plurality of protocol converter chips, wherein each of the subordinate general management processors is connected to one of the protocol converter chips to allow the specialized processors to communicate with the subordinate general management processors.

2. The stacked-wafer processor-memory system according to claim 1, wherein:
each of the specialized processor wafers further comprises a wiring level connecting together the specialized processors of the each specialized processor wafer.

3. The stacked-wafer processor-memory system according to claim 1, further comprising:
a network of inter-strata through silicon vias for delivering power and ground to the specialized processor wafers.

4. The stacked-wafer processor-memory system according to claim 2, further comprising:
a wiring wafer comprising a plurality of wiring levels; and wherein:
the lead general management processor and the plurality of subordinate general management processors are connected to the wiring levels of the wiring wafer.

5. The stacked-wafer processor memory system according to claim 4, wherein:
the wiring wafer is mounted on top of the plurality of specialized processor wafers.

6. The stacked-wafer integrated circuit according to claim 1, further comprising an interposer, and wherein:
the plurality of specialized processor wafers are stacked on the interposer.

7. The stacked-wafer integrated circuit according to claim 6, wherein:
the lead general management processor and the subordinate general management processors are mounted on the interposer.

8. The stacked-wafer integrated circuit according to claim 1, wherein:
each of the specialized processors is embedded within the associated memory domain of the memory area.

9. The stacked-wafer integrated circuit according to claim 8, wherein:
each of the specialized processors controls the associated memory domain of the memory area.

10. The stacked-wafer integrated circuit according to claim 1, wherein:
each of the specified processors is embedded within and controls a respective one associated memory domain of the memory area; and
the lead general management processor controls the general management processors to implement hierarchical processing in the stacked-wafer integrated circuit.

11. A method of fabricating a stacked wafer processor-memory system, the method comprising:
fabricating a plurality of specialized processor wafers, each of the specialized processor wafers comprising a memory area and a multitude of specialized processors embedded in the memory area of the each specialized processor wafer, each of the specialized processors being configured to perform a specified set of operations using an associated memory domain of the memory area of the each specialized processor wafer;
connecting a plurality of subordinate general management processors to the specialized processors, each of the subordinate general management processors being configured to manage an associated set of the specialized processors;
connecting a lead general management processor to an input/output connection and to the subordinate general management processors to communicate therewith;
connecting each of the subordinate general management processor to a protocol converter chip to allow the specialized processors to communicate with the subordinate general management processors; and
forming a network of inter-strata through silicon vias for delivering power and ground to the specialized processor wafers.

12. The method according to claim 11, further comprising:
fabricating a wiring wafer, said wiring waver including wiring levels for the lead general management processor and the subordinate general management processors; and wherein:
the connecting a plurality of subordinate general management processors to the specialized processors includes connecting the plurality of subordinate general management processors to the wiring levels of the wiring wafer; and
the connecting a lead general management processor to the subordinate general management processors includes connecting the lead general management processor to the wiring levels of the wiring wafer.

13. The method according to claim 12, wherein the connecting the plurality of subordinate general management processors to the wiring levels of the wiring wafer includes bonding the plurality of subordinate general management processors to the wiring wafer using a layer of micro controlled collapse-chip connections.

14. The method according to claim 11, wherein the fabricating a plurality of specialized processor wafers includes adding a wiring level to each of the specialized processor wafers to connect together the specialized processors of the each specialized processor wafer.

15. The method according to claim 11, further comprising:
bonding the plurality of specialized processor wafers together into a stack;
mounting said stack onto an interposer board; and wherein:
the connecting a lead general management processor to the subordinate general management processors includes mounting the lead general management processor on the interposer board; and
the connecting a plurality of subordinate general management processors to the specialized processors includes mounting the subordinate general management processors on the interposer board.

16. A stacked-wafer processor-memory system comprising:
a plurality of wafers arranged in a stack, including
at least one memory wafer comprising a multitude of memory domains, and
at least one processor wafer comprising a multitude of specialized processors, each of the specialized processors controlling a respective one of the memory domains of the memory wafer;
an input/output connection;
a multitude of general management processors including
a multitude of subordinate general management processors, each of the subordinate general management processors being connected to a respective one, associated set of the specialized processors for controlling said associated set of the specialized processors, and
a lead general management processor in communication with the input/output connection and with the subordinate general management processors for transmitting data to and receiving data from the subordinate general management processors;
a plurality of protocol converter chips, wherein each of the subordinate general management processors is connected to one of the protocol converter chips to allow the specialized processors to communicate with the subordinate general management processors; and
a network of through silicon vias for delivering power and ground to the specialized processor wafers and for communicating with the general management processors.

17. The stacked-wafer processor-memory system according to claim 16, wherein:
the at least one memory wafer includes a plurality of memory wafers;
the at least one processor wafer includes a plurality of processor wafers; and
in said stack, the plurality of memory wafer alternate with the plurality of processor wafers.

18. The stacked-wafer processor-memory system according to claim 17, wherein:
each of the plurality of processor wafers includes a wiring level connecting together the processors of said each processor wafer.

19. The cortical structure according to claim 16, further comprising:
a wiring wafer; and wherein:
the multitude of general management processors are mounted on the wiring wafer.

20. The stacked-wafer processor-memory system according to claim 19, wherein the wiring wafer is mounted on said stack.

* * * * *